United States Patent [19]
Gonzalez et al.

[11] Patent Number: 5,030,585
[45] Date of Patent: Jul. 9, 1991

[54] SPLIT-POLYSILICON CMOS DRAM PROCESS INCORPORATING SELECTIVE SELF-ALIGNED SILICIDATION OF CONDUCTIVE REGIONS AND NITRIDE BLANKET PROTECTION OF N-CHANNEL REGIONS DURING P-CHANNEL GATE SPACER FORMATION

[75] Inventors: Fernando Gonzalez; Joseph J. Karniewicz, both of Boise, Id.

[73] Assignee: Micron Technology, Inc., Boise, Id.

[21] Appl. No.: 498,184

[22] Filed: Mar. 22, 1990

[51] Int. Cl.$^5$ .................. H01L 21/265; H01L 21/336; H01L 27/092; H01L 27/108

[52] U.S. Cl. .................................. 437/47; 437/34; 437/44; 437/52; 437/57; 357/23.6

[58] Field of Search .................. 437/34, 40, 41, 44, 437/47, 48, 50, 52, 54, 56, 57, 59, 60, 196, 200, 233; 357/23.6; 148/DIG. 147

[56] References Cited

U.S. PATENT DOCUMENTS

| | | | |
|---|---|---|---|
| 4,561,170 | 12/1985 | Doering et al. | 437/48 |
| 4,871,688 | 10/1989 | Lowrey | 437/48 |
| 4,945,066 | 7/1990 | Kang et al. | 437/47 |
| 4,957,878 | 9/1990 | Lowrey et al. | 437/47 |

FOREIGN PATENT DOCUMENTS

| | | | |
|---|---|---|---|
| 0017164 | 1/1982 | Japan | 437/34 |
| 0213051 | 10/1985 | Japan | 437/44 |
| 0165355 | 7/1987 | Japan | 437/233 |
| 2150349 | 6/1985 | United Kingdom | 437/48 |

Primary Examiner—Olik Chaudhuri
Assistant Examiner—M. Wilczewski
Attorney, Agent, or Firm—Angus C. Fox, III

[57] ABSTRACT

A split-polysilicon CMOS DRAM process incorporating selective, self-aligned silicidation of conductive regions and silicon nitride blanket protection of N-channel regions during the etch steps which create P-channel transistor gate spacers, thus avoiding transistor breakdown voltage problems associated with the double etching of the N-channel regions that was heretofore required for the creation of LDD-type P-channel transistors and self-aligned silicidation of conductive regions utilizing a split-polysilicon CMOS process. A CVD anti-silicidation oxide layer and a protective silicon nitride layer are blanket deposited on top of all circuitry following the patterning of the cell plate. The protective nitride layer protects the N-channel regions during the etches used to create the P-channel channel transistor gate spacers. Following the stripping of the protective nitride layer, an optional antisilicidation thermal oxide layer may be grown on the P-channel substrate. A silicidation isolation mask may be utilized to prevent removal of certain portions of the anti-silicidation oxide layers, thus permitting subsequent silicidation of selected conductive regions within the circuitry.

18 Claims, 23 Drawing Sheets

SPLIT-POLYSILICON CMOS DRAM PROCESS INCORPORATING SELECTIVE SELF-ALIGNED SILICIDATION OF CONDUCTIVE REGIONS AND NITRIDE BLANKET PROTECTION OF N-CHANNEL REGIONS DURING P-CHANNEL GATE SPACER FORMATION

FIELD OF THE INVENTION

This invention relates to semiconductor technology and, more specifically, to processes for creating dynamic random access memories using CMOS technology. This invention is primarily concerned with a process, to be used in conjunction with a split-polysilicon CMOS process, for creating dynamic random access memory circuitry having LDD-type transistors in both the N-channel and P-channel regions, and for selectively, self-alignedly siliciding conductive regions within the circuitry, which may include the cell plate, the gates, sources and drains of both N-channel and P-channel transistors (except those which are covered by the cell plate) using a minimum number of processing steps.

BACKGROUND OF THE INVENTION

Most current-generation dynamic random access memories (DRAMs) utilize CMOS technology. Although the term "CMOS" is an acronym for (C)omplementary (M)etal (O)xide (S)emiconductor, the term CMOS is now more loosely applied to any integrated circuit in which both N-channel and P-channel field-effect transistors are used in a complementary fashion. Although CMOS integrated circuit devices are often referred to as "semiconductor" devices, such devices are fabricated from various materials which are either electrically conductive, electrically nonconductive or electrically semiconductive. Silicon, the most commonly used semiconductor material can be made conductive by doping it (introducing an impurity into the silicon crystal structure) with either an element such as boron which has one less valence electron than silicon, or with an element such as phosphorus or arsenic which have one more valence electron than silicon. In the case of boron doping, electron "holes" become the charge carriers and the doped silicon is referred to as positive or P-type silicon. In the case of phosphorus or arsenic doping, the additional electrons become the charge carriers and the doped silicon is referred to as negative or N-type silicon. If a mixture of dopants having opposite conductivity types is used, counter doping will result, and the conductivity type of the most abundant impurity will prevail. Silicon is used either in single-crystal or polycrystalline form. Polycrystalline silicon is referred to hereinafter as "polysilicon" or simply as "poly". Although polysilicon has largely replaced metal for the MOS device gates, the inherently high conductivity of a metal has led many semiconductor manufacturers to create a layer of refractory metal silicide on transistor gates in order to increase device speed.

CMOS DRAM processes begin with a lightly-doped P-type or N-type silicon substrate. Suffice it to be said that, prior to the development of the split-polysilicon CMOS process, fabrication of a CMOS DRAM memory required at least 12 photoresist masking steps to create both N-channel and P-channel transistors and the cell capacitor on a silicon substrate (an additional one or two masks is required if lightly-doped drain design is required for both types of transistors). No attempt is made at siliciding source and drain regions in this process.

A pending U.S. patent application Ser. No. 07/427,639, submitted by Tyler A. Lowrey, Randal W. Chance, and Ward D. Parkinson of Micron Technology, Inc. of Boise, Idaho provides a detailed description of the heretofore mentioned split-polysilicon CMOS process. By processing N-channel and P-channel devices separately, three photomasking steps can be eliminated in the manufacture of high-performance CMOS circuits. As with the conventional CMOS process, a single polysilicon layer is used to form both N-channel and P-channel gates. However, N-channel devices are formed first, with an expanse of unetched polysilicon left in the future P-channel regions until N-channel processing is complete.

Another copending U.S. patent application Ser. No. 07/485,029 entitled "Split Polysilicon CMOS Process Incorporating Self-Aligned Silicidation of Conductive Regions" and submitted by Tyler Lowrey, Mark Durcan, Trung Doan, Gordon Haller, and Mark Tuttle (all of Micron Technology, Inc.) builds on the standard split polysilicon CMOS process by incorporating self-aligned silicidation of all conductive regions (i.e., gates, sources and drains of both N-channel and P-channel transistors). This process requires the deposition and anisotropic dry etch of a transistor sidewall spacer oxide layer for each transistor type. The spacers are used not only to offset transistor source/drain implants, but to prevent silicidation of the transistor gate sidewalls. Using this process, both spacer etch steps must be carefully monitored in order to prevent excessive etching of the field isolation oxide and the doped silicon in the active areas which function as the sources and drains for both types of transistors. Any significant removal of this doped silicon will degrade transistor performance, specifically with regard to junction leakage. Hence, poor control over the spacer etches may lead to poor manufacturing yields.

A further copending U.S. patent application Ser. No. 07/491,784 entitled "Split-Polysilicon CMOS DRAM Process Incorporating Self-Aligned Silicidation of the Cell Plate, Transistor Gates and N+ Regions", submitted by Ruojia Lee, Tyler Lowrey, Fernando Gonzalez, Joseph Karniewicz and Piere Fazan (all of Micron Technology, Inc.) is another variation on the split-polysilicon process that deals with the spacer etch problem of the aforementioned process by eliminating the spacer etch for P-channel transistor gates. Although this precludes the formation of P-channel transistors of lightly-doped drain design, silicidation of P-channel transistor gates is made possible by a light oxidation step which coats the P-channel transistor polysilicon gate sidewalls with a protective oxide layer. A nitride layer, which serves as both the cell capacitor dielectric and as a protective layer against oxidation of the top surface of the P-channel transistor gates during the aforementioned light oxidation step, is removed prior to the silicidation process.

SUMMARY OF THE INVENTION

The process which is the subject of the present invention avoids the N-channel sidewall spacer and active area etch problem of the aforementioned split-polysilicon silicide process by protecting existing N-channel devices with a protective nitride layer during the etches used to create P-channel gate sidewall spacers. This improved process departs from the standard split-polysilicon process flow following gate sidewall spacer formation and source/drain implantation for N-channel transistors. At this point, the blanket deposition of a cell capacitor dielectric layer is followed by the blanket deposition of a polysilicon cell plate layer. Following the patterning and etching of these two layers to create a cell plate, the circuitry is blanketed with a silicon dioxide anti-silicidation layer, and then blanketed again with a silicon nitride protective layer. A photomask is then used both to pattern P-channel transistor gates and to cover all N-channel devices. P-channel transistor gates are created by a series of three (preferably anisotropic) etches: a nitride etch, an oxide etch and a polysilicon etch, in that order. Following an unmasked phosphorus P-channel punch-through implant, a mini-spacer oxide layer is blanket deposited, after which a low-dosage unmasked boron or boron difluoride implant creates lightly-doped P-channel source/drain regions. A principal spacer oxide layer is then blanket deposited and anisotropically etched to create P-channel gate spacers. A heavily-doped P-channel source/drain implant is followed by an optional isotropic oxide etch which eliminates any unwanted spacer oxide layer remnants. Following a reoxidation of P-channel source/drain regions, the protective nitride layer is stripped. An optional silicidation isolation photomask may then be used to cover certain conductive regions where silicidation is not desired. An oxide etch then clears all silicon dioxide that is not subjacent the silicidation isolation photomask. The silicidation isolation photomask is then stripped, and all silicon regions that have been exposed by the removal of silicon dioxide are silicided through the deposition and sintering of a titanium layer in a nitrogen ambient.

PREFERRED EMBODIMENT OF THE INVENTION

Figure 1:
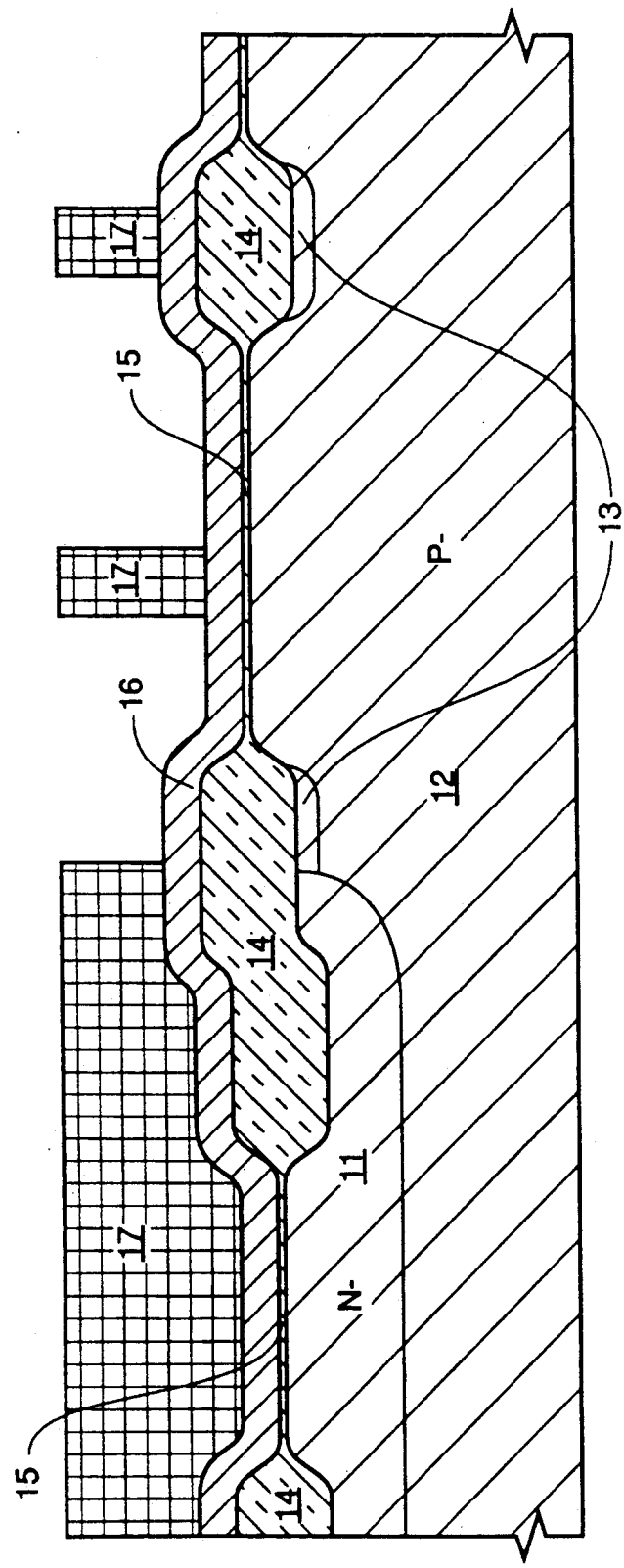
FIG. 1 is a cross-sectional view of a representative CMOS circuit during the fabrication following the creation of an N-well within a lightly-doped P-type substrate, a masked boron field isolation implant, creation of field oxide regions using conventional LOCOS, an unmasked boron transistor threshold enhancement implant, deposition of a first polysilicon layer, doping of the first polysilicon layer with phosphorus, and masking of the first polysilicon layer with a first photomask.

Since the focus of this disclosure comprises improvements to the existing split-polysilicon CMOS process whereby existing N-channel devices are shielded from the etch steps used to create the transistor gate spacers for the P-channel devices with a protective nitride layer and conductive regions may be selectively and self-alignedly silicided by employing an option silicide isolation photomask, the split-polysilicon process flow will be covered in this disclosure only to the extent required to understand the improvement process flow in the proper context. The circuit cross section depicted in FIGS. 1 through 17 is not meant to be a portion of an actual circuit, but rather a representative portion of a circuit which incorporates the significant features of the improved process. Although the improved process will be shown in the context of DRAM memory fabrication, the improvements could apply just as well to a non-memory CMOS application.

Referring now to Figure a cross-sectional view of a CMOS dynamic random access memory (DRAM) circuit is shown during fabrication following the conventional creation of an N-well 11 within a lightly-doped P-type substrate 12, a masked boron field isolation implant 13, creation of field oxide regions 14 using conventional local oxidation of silicon (LOCOS), an unmasked, boron transistor threshold enhancement implant (not shown), thermal oxidation of exposed silicon substrate to create a gate oxide layer 15, deposition of a first polysilicon (poly) layer 16, conductive doping of the first poly layer 16 with phosphorus, and masking of the first polysilicon layer 16 with a first photoresist mask 17(hereinafter also photomask). As previously disclosed in the split-polysilicon process, the first photomask 17 is used to pattern the gates of the N-channel transistors and interconnects and to cover the N-well (P-channel) region 11.

Figure 2:
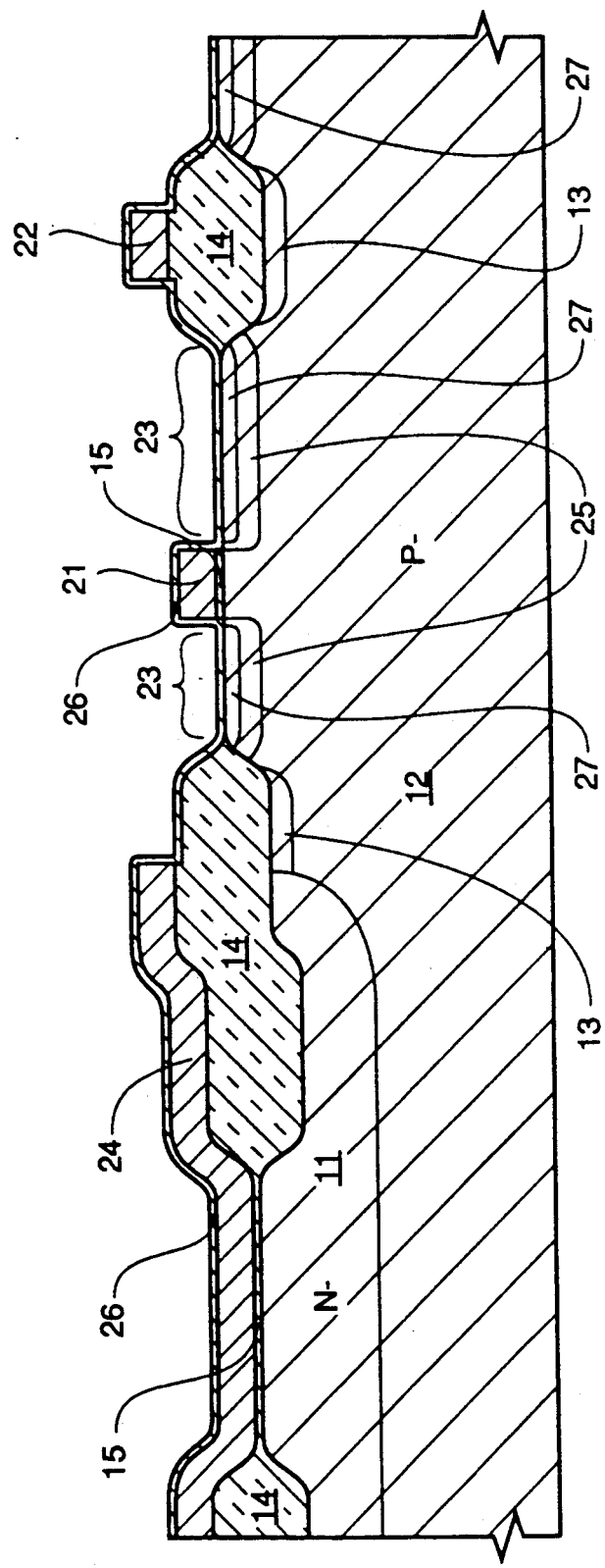
FIG. 2 is a cross-sectional view of the circuit of FIG. 1 following a first etch of the first poly layer and underlying gate oxide, stripping of the first photomask, a subsequent boron punch-through implant, followed the deposition of a first mini-spacer silicon dioxide layer and a subsequent low-dosage N-channel source/drain implant.

Referring now to FIG. 2, following an anisotropic dry etch which creates the N-channel transistor gates 21, word lines 22, removes gate oxide in N-channel active areas 23, and creates an expanse of unetched poly 24 in N-well region 11, the first photomask 17 is stripped. Following a blanket, self-aligned, low-dosage boron or boron-difluoride punch-through implant which creates lightly-doped, N-channel punch-through implant regions 25 that extend to the edges of the N-channel transistor gates 21, a mini silicon dioxide spacer layer 26 having a thickness in the range of 300 to 1500 angstroms is blanket deposited using chemical vapor deposition (CVD). Thermal oxidation may also be used to oxidize exposed silicon to create an essentially equivalent mini silicon dioxide spacer layer. The purpose of mini silicon dioxide spacer layer 26 is to coat the sides of transistor gates 21, so that when the circuitry is subjected to a low-dosage phosphorus implant, self-aligned lightly-doped N-channel source/drain regions 27 are created in the N-channel active areas 23, said regions 27 being offset from the vertical boundaries of N-channel punch-through implant regions 25.

Figure 3:
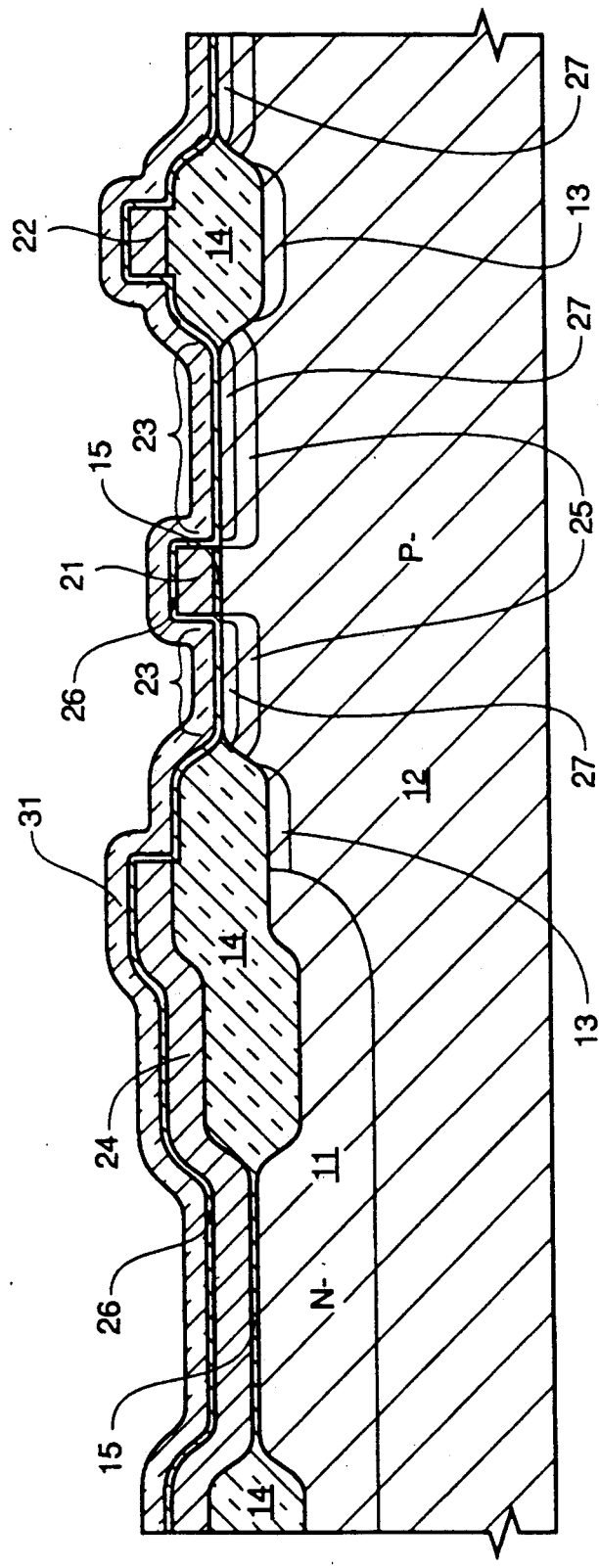
FIG. 3 is a cross-sectional view of the circuit of FIG. 2 following the blanket deposition of a first principal spacer silicon dioxide layer.

Referring now to FIG. 3, a first principal silicon dioxide spacer layer 31 has been blanket deposited on top of all circuitry through chemical vapor deposition.

Figure 4:
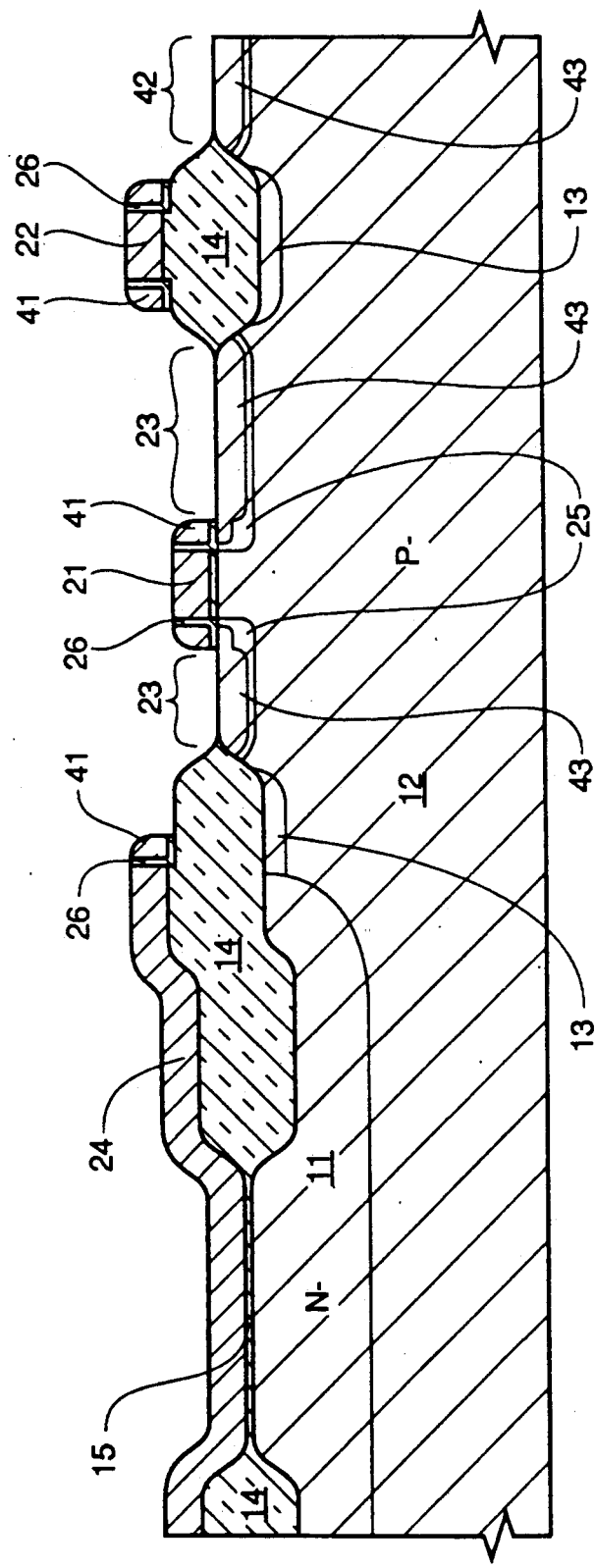
FIG. 4 is a cross-sectional view of the circuit of FIG. 3 following an anisotropic etch of both the first principal spacer silicon dioxide layer and the first mini-spacer silicon dioxide layer, and a high-dosage N-channel source/drain implant.

Referring now to FIG. 4, an anisotropic etch and an optional isotropic etch (in that order) of the first principal silicon dioxide spacer layer 31 and the first mini silicon dioxide spacer layer 26 has created oxide spacers 41 on the sides of the N-channel transistor gates 21, the N-channel interconnects or word lines 22 and the unetched expanse of poly in N-well region 11. The anisotropic and isotropic etches clear the N-channel active areas 23 of all oxide. Spacer formation is followed by a high-dosage blanket phosphorus or arsenic implant, which creates heavily-doped N-channel source/drain regions 42. Doping of the unetched expanse of poly 24 in the P-channel or N-well region 11 with the aforementioned N-channel implants will have essentially no effect on P-channel transistor performance, since only the gate is affected, with the future source and drain regions remaining untouched.

Figure 5:
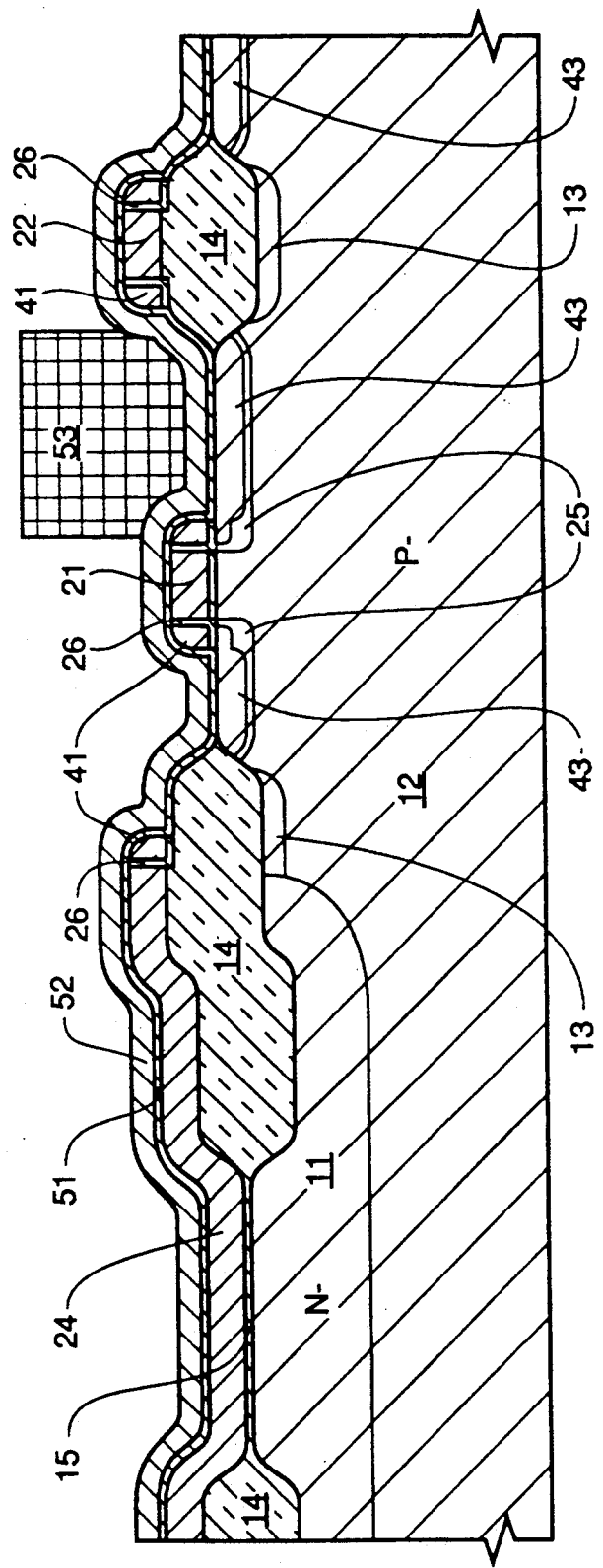
FIG. 5 is a cross-sectional view of the circuit of FIG. 4 following the blanket deposition of a first nitride layer, the blanket deposition of a second poly layer and masking of the second poly layer with a second photomask.

Referring now to FIG. 5, the blanket deposition of a first silicon nitride layer 51 is followed by the blanket deposition of a second poly layer 52. Following the conductive doping of the second poly layer 52 with phosphorus, it is masked with a second photomask 53 which defines the cell plate regions.

Figure 6:
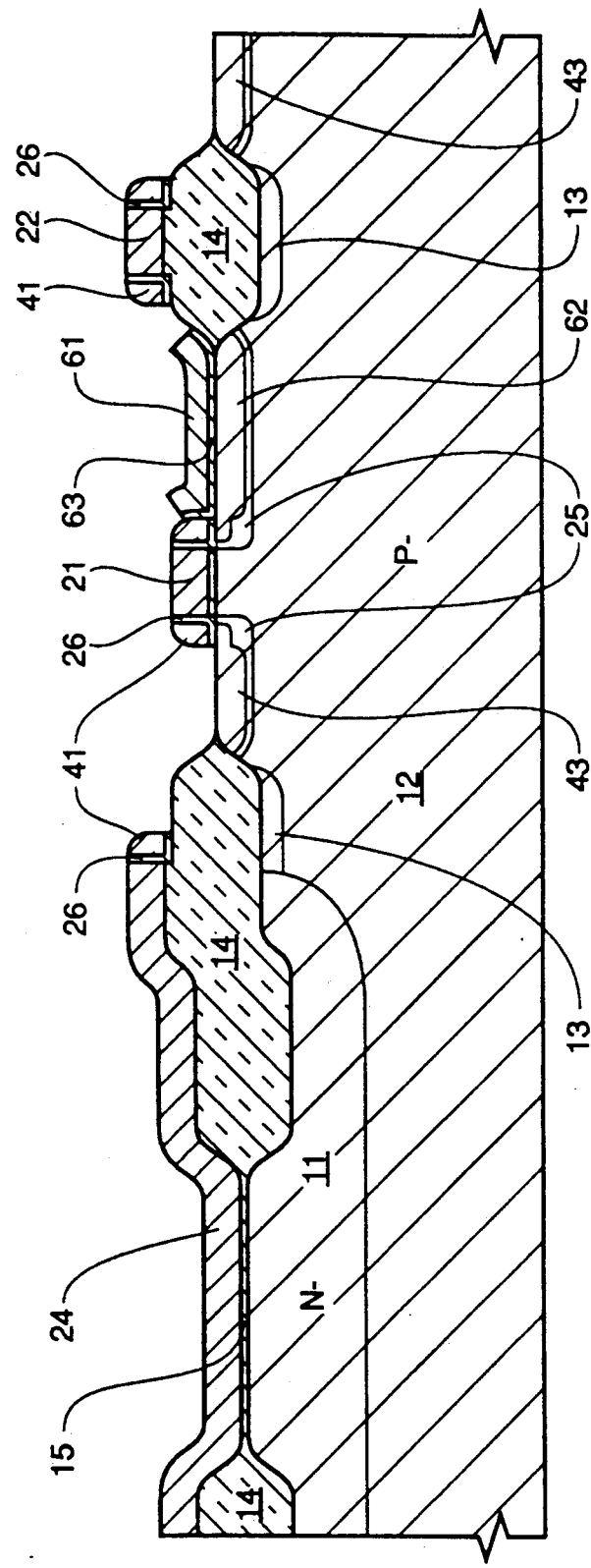
FIG. 6 is a cross-sectional view of the circuit of FIG. 5 following an isotropic etch of the second poly layer, a first nitride etch, and stripping of the second photomask.

Referring now to FIG. 6, an isotropic etch of second poly layer 52, followed by an etch of first nitride layer 51 has created a cell plate 61 that is insulted from storage node substrate region 62 by first nitride layer remnant 63. The second photomask 53 is then stripped. Alternatively, the second photomask 53 could be stripped following the isotropic etch of the second poly layer 52 and prior to the etch of first nitride layer 51.

Figure 7:
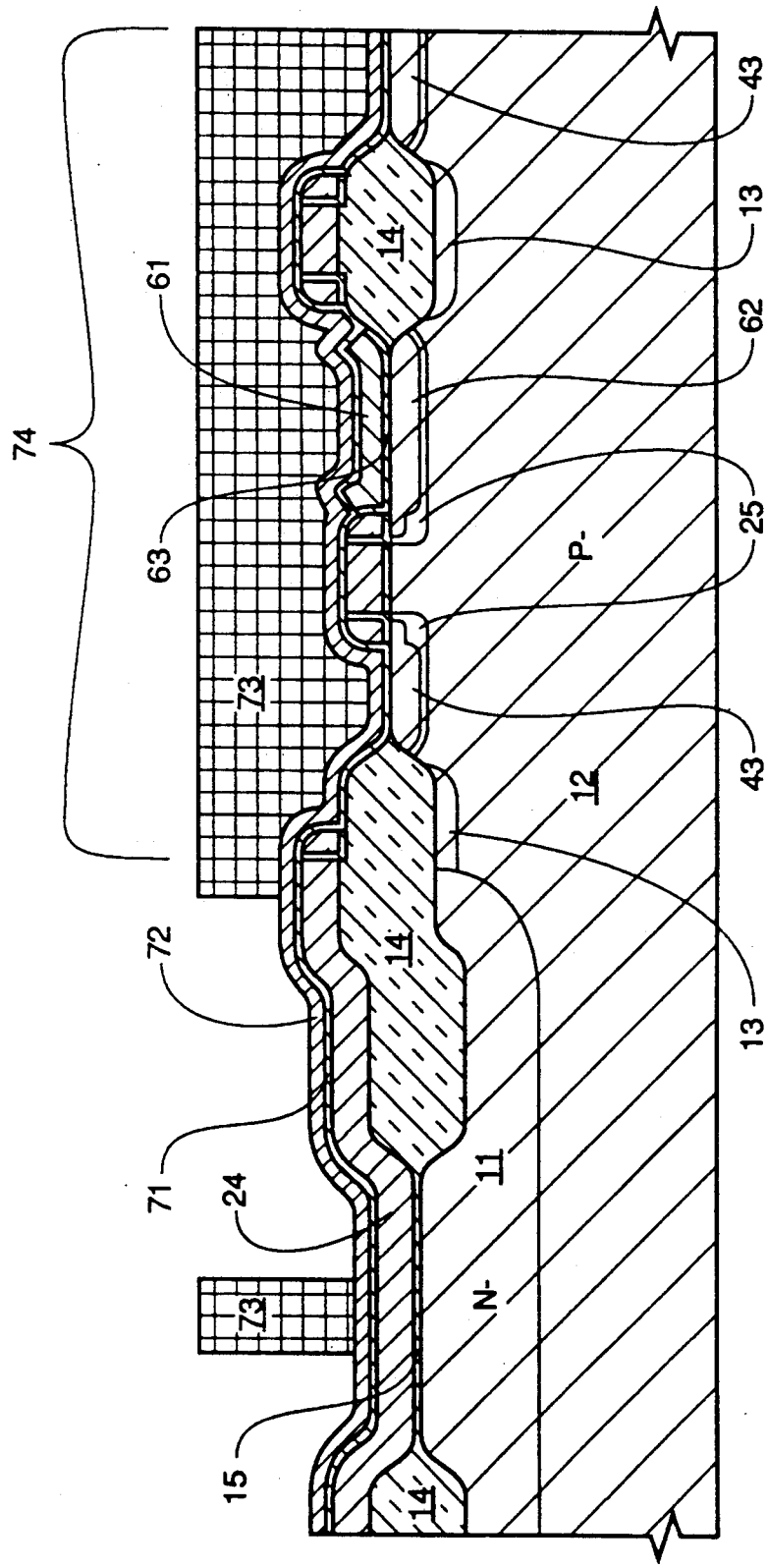
FIG. 7 is a cross-sectional view of the circuit of FIG. 6 following the blanket deposition of a silicon dioxide anti-silicidation layer, the blanket deposition of a protective nitride layer, and masking of the protective nitride layer with a third photomask which covers the N-channel regions and patterns the P-channel transistors.

Referring now to FIG. 7, a first anti-silicidation silicon dioxide layer 71, having a thickness of approximately 400 angstroms, is blanket deposited (preferably using chemical vapor deposition) on top of all circuitry. This is followed by the blanket deposition of an approximately 1,500-angstrom-thick protective nitride layer 72. Protective nitride layer 72 is then masked with a third photomask 73, which covers the N-channel regions 74 and patterns the P-channel transistors.

Figure 8:
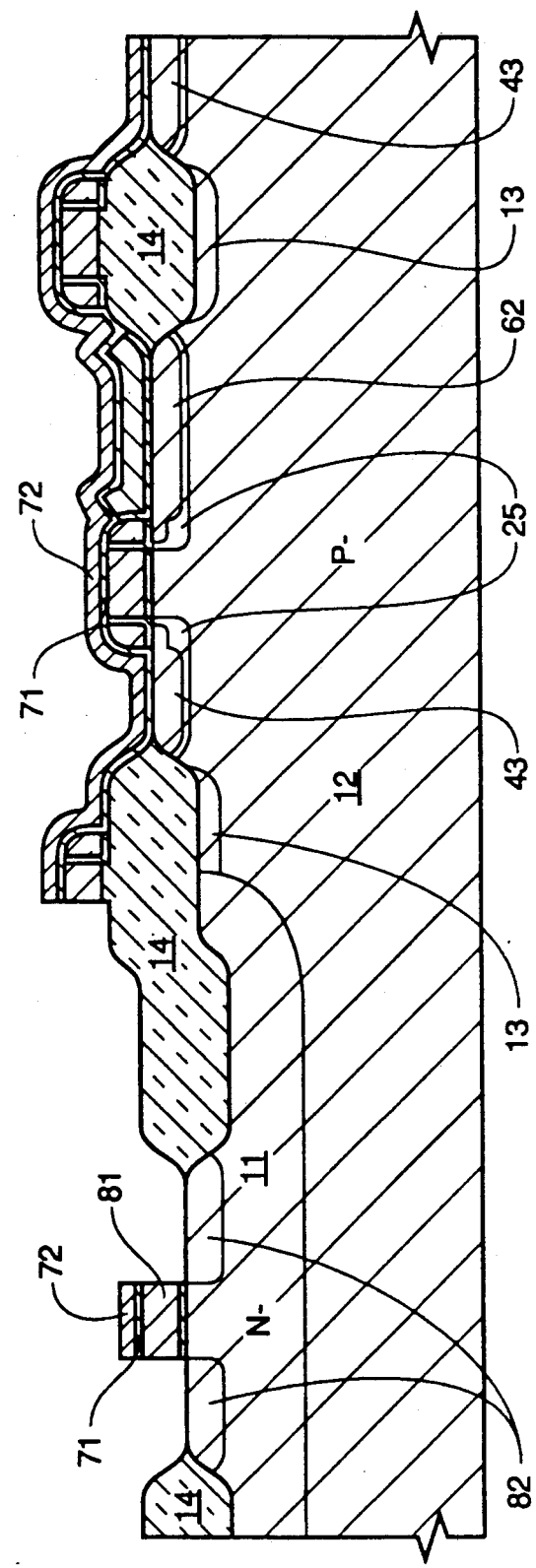
FIG. 8 is a cross-sectional view of the circuit of FIG. 7 following the etching of those portions of the protective nitride layer, the anti-silicidation silicon dioxide layer and the first poly layer that are not subjacent the third photomask, stripping of the third photomask, and a phosphorus P-channel punch-through implant.

Referring now to FIG. 8, following the etching of those portions of the protective nitride layer 72, the anti-silicidation dioxide layer 71 and the first poly layer remnant 24 in the N-well region that are not subjacent the third photomask 73, the third photomask 73 is stripped. A P-channel transistor gate 81 has been created. The circuitry is then subjected to an unmasked, low-dosage phosphorus implant, which creates P-channel punch-through regions 82.

Figure 9:
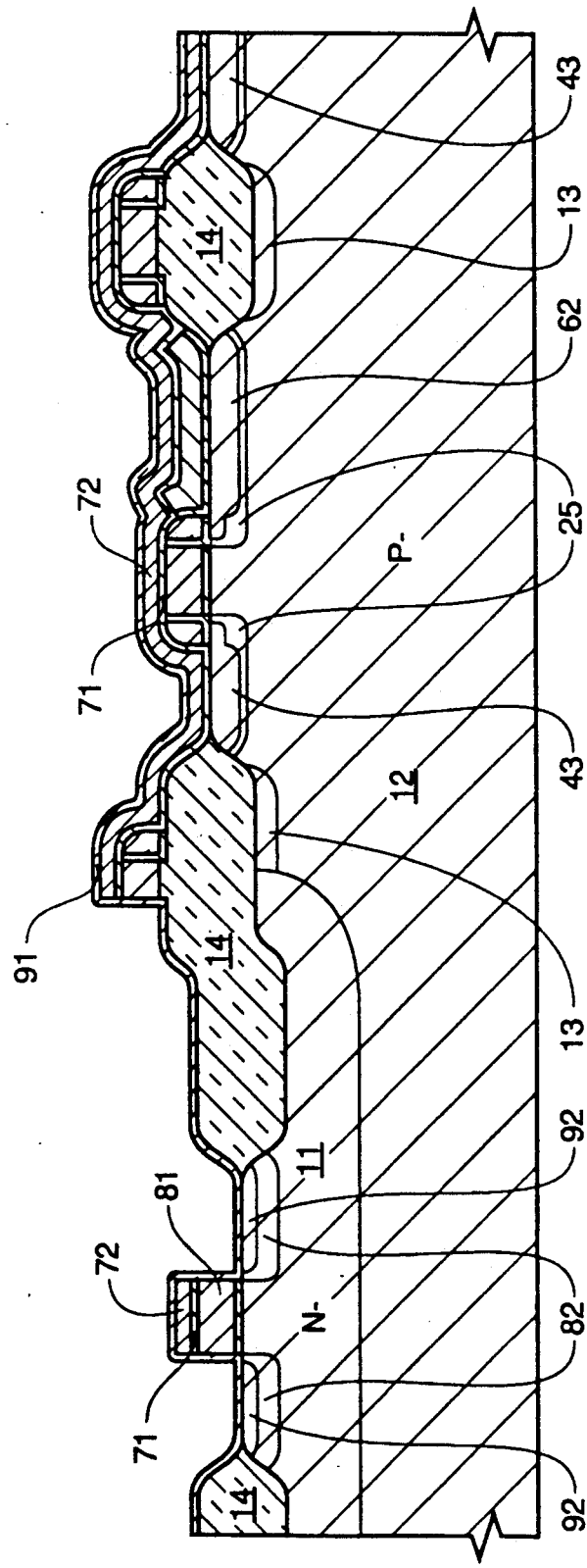
FIG. 9 is a cross-sectional view of the circuit of FIG. 8, following the blanket deposition of a second mini-spacer silicon dioxide layer and a subsequent low-dosage boron or boron-difluoride P-channel source/drain implant.

Referring now to FIG. 9, following the blanket chemical vapor deposition of a second mini silicon dioxide spacer layer 91, a low-dosage boron or boron difluoride implant creates lightly-doped P-channel source/drain regions 92, which are offset from the edges of the P-channel transistor gate 81 and P-channel punch-through implant regions 82. Alternatively, an oxidation step could also create mini spacer layer 91 through consumption of exposed silicon.

Figure 10:
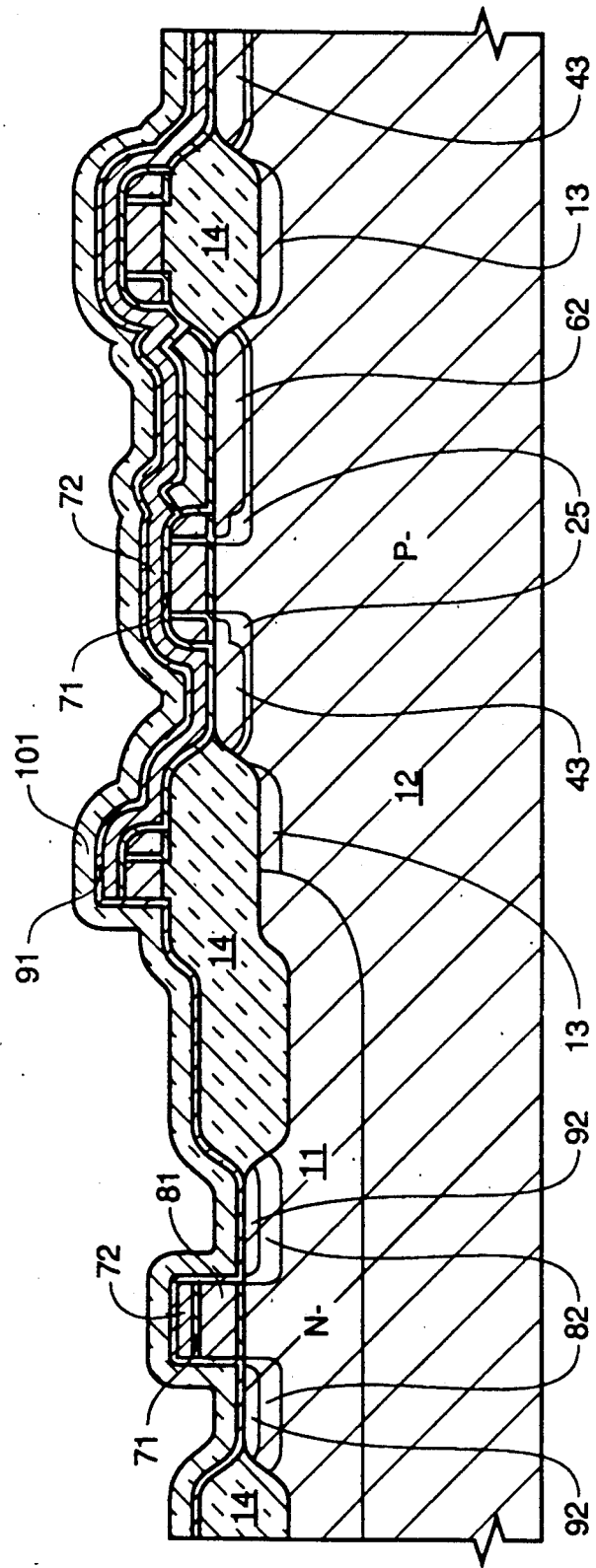
FIG. 10 is a cross-sectional view of the circuit of FIG. 9 following the deposition of a second principal spacer silicon dioxide layer.

Referring now to FIG. 10, a second principal silicon dioxide spacer layer 101 is blanket deposited on top of all circuitry.

Figure 11:
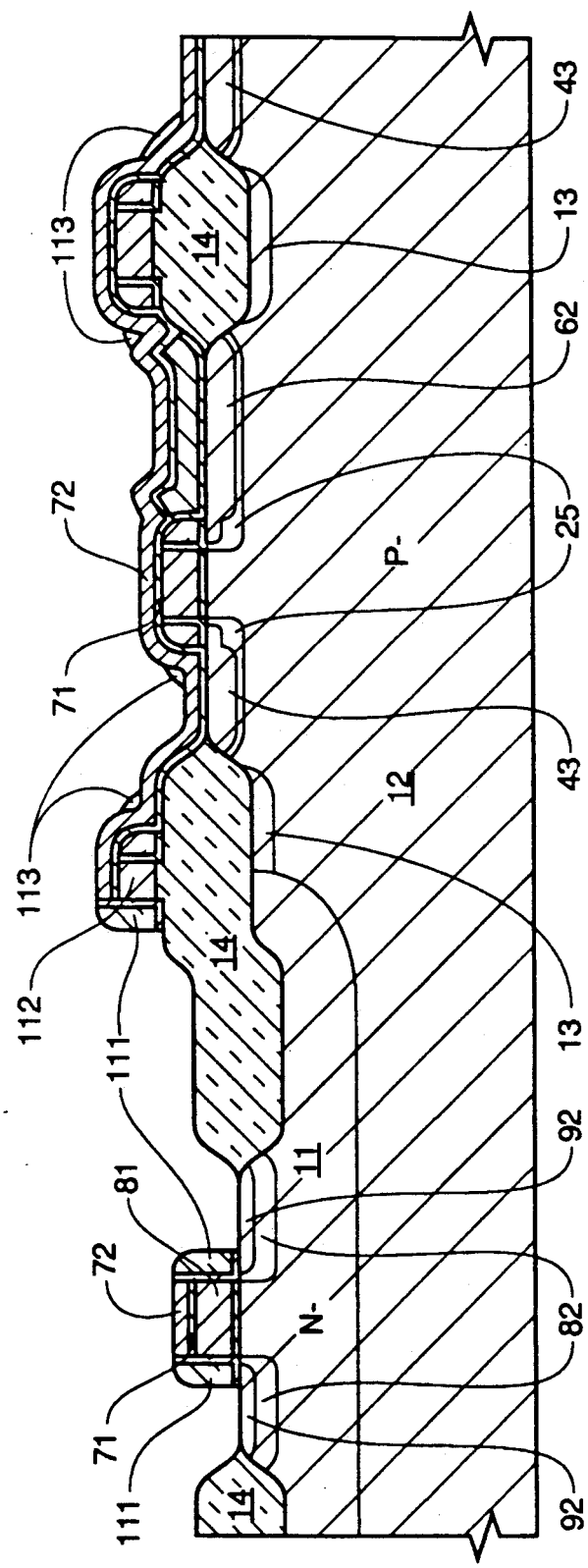
FIG. 11 is a cross-sectional view of the circuit of FIG. 10 following an anisotropic etch of both the second principal spacer silicon dioxide layer and the second mini spacer silicon dioxide layer, and a heavily-doped P-channel source/drain implant.

Referring now to FIG. 11, an anisotropic etch of both second principal spacer layer 101 and second mini spacer layer 91 has created spacers 111 on the sides of P-channel transistor gate 81 and on the side of the hedge 112 that sits atop the central field oxide region 14. Hedge 143, incidently, is merely the result of mask overlap during the two-stage gate patterning sequence that is a characteristic of a split-polysilicon CMOS process. It will be noted that the anisotropic etch has failed to remove certain portions (remnants) 113 of the second mini spacer layer 91 and second principal spacer layer 101.

Figure 12:
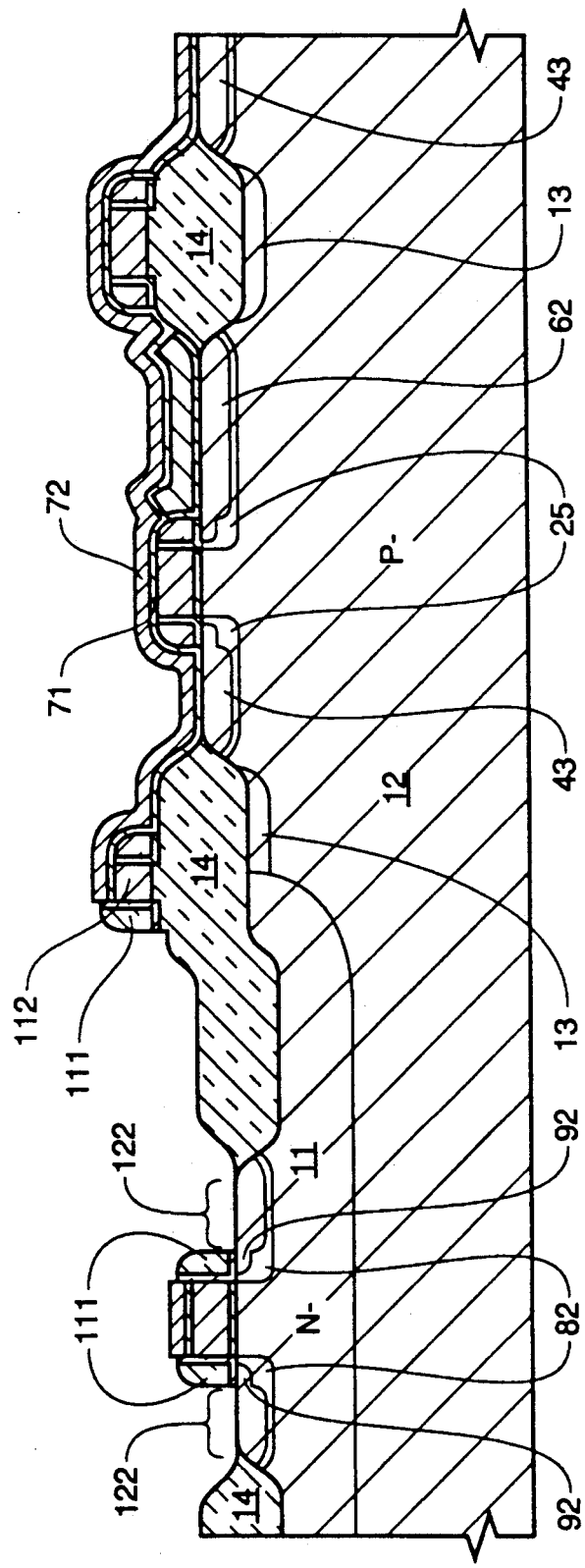
FIG. 12 is a cross-sectional view of the circuit of FIG. 11 following a second isotropic silicon dioxide etch.

Referring now to FIG. 12, an isotropic silicon dioxide etch removes spacer layer remnants 113. Removal of the remnants 113 is necessary, since their presence would interfere with subsequent removal of the protective nitride layer 72. The isotropic etch which removes remants 113 also thins exposed portions of field oxide region 14, removes exposed gate oxide in the P-channel active areas 121, and reduces the size of the P-channel transistor gate sidewall spacers 111. A high-dosage boron or boron difluoride implant creates heavily-doped P-channel source/drain regions 122 that are offset from lightly-doped P-channel source/drain regions 92.

Figure 13:
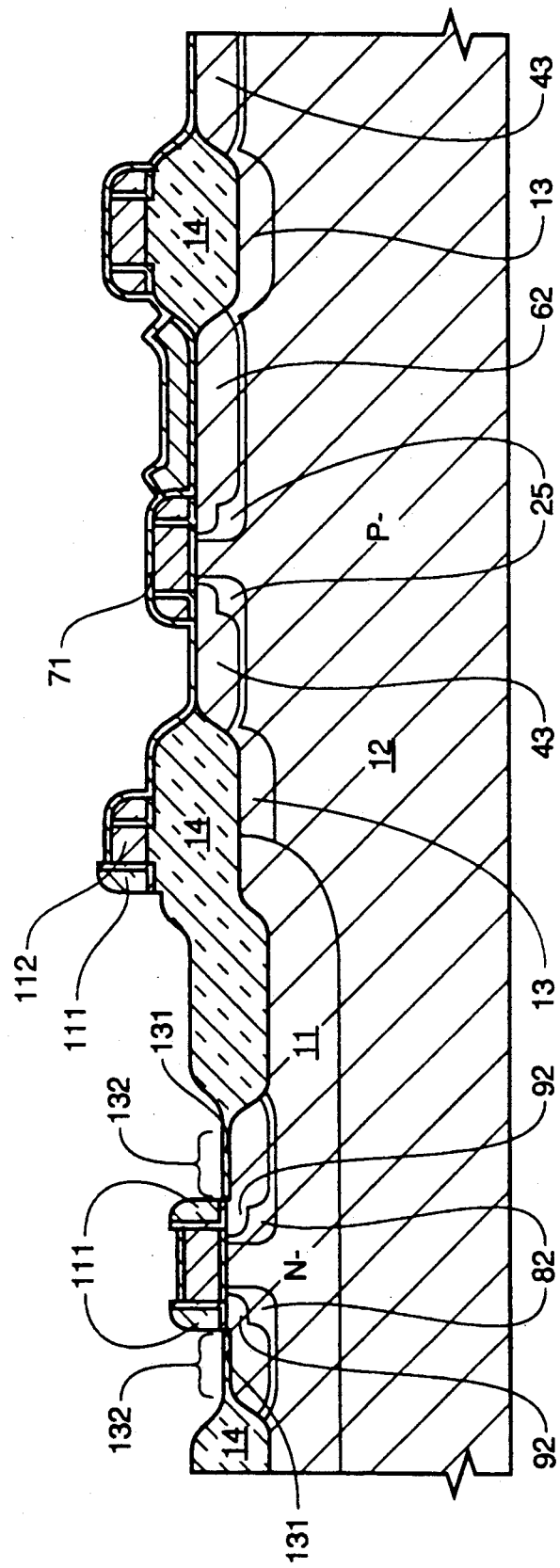
FIG. 13 is a cross-sectional view of the circuit of FIG. 12 following a second nitride etch which removes the protective nitride layer.

Referring now to FIG. 13, a nitride etch is used to strip protective nitride layer 72. Following removal of the protective nitride layer 72, the circuitry is subjected to an elevated-temperature drive-in step in an oxygen ambient. The drive step causes all implants to diffuse, and in the source and drain regions for both N-channel and P-channel transistors, the diffusion results in the lightly-doped N-channel source/drain implant 27 and the lightly-doped P-channel source/drain implant 92 being driven beneath the edges of their associated transistor gates. In the presence of elevated temperature and oxygen, a second anti-silicidation silicon dioxide layer 131 approximately 50 to 100 angstroms thick is thermally grown on top of the P-channel active areas 132.

Figure 14:
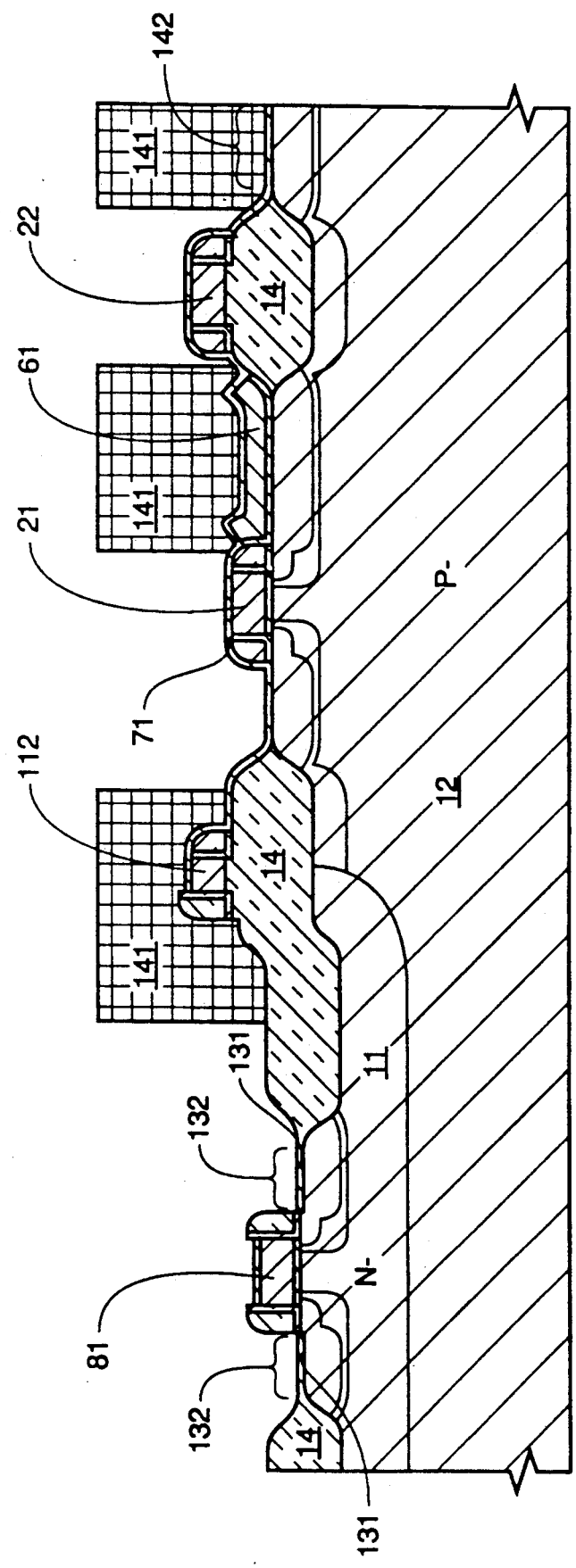
FIG. 14 is a cross-sectional view of the circuit of FIG. 13 following masking with a first version of an optional silicide isolation mask.

Referring now to FIG. 14, the circuitry of FIG. 13 has been masked with a first version of an optional silicide isolation mask 141. This particular mask covers an N-channel active area 142, the cell plate 61, and hedge 112.

Figure 14A:
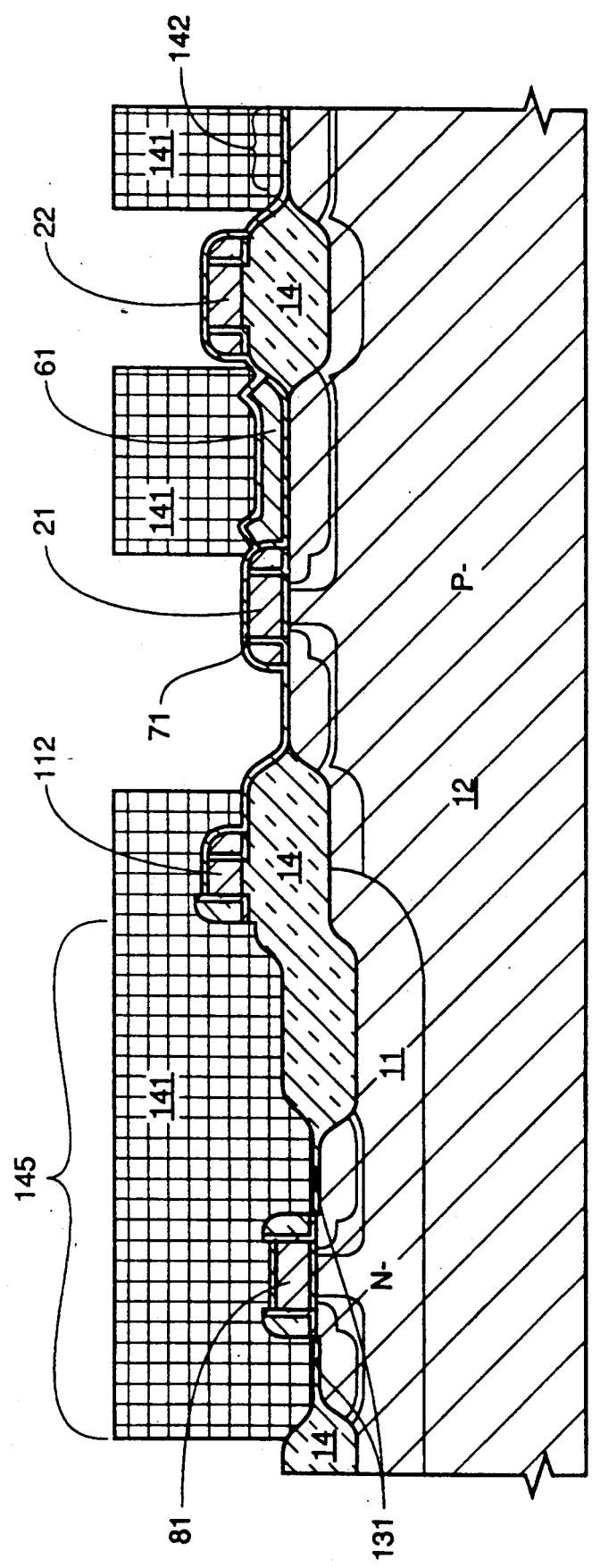
FIG. 14A is a cross-sectional view of the circuit of FIG. 13 following masking with a second version of an optional silicide isolation mask.

Referring now to FIG. 14A, the circuitry of FIG. 13 has been masked with a second version of an optional silicide isolation mask 144. This particular mask expands the coverage of the mask depicted in FIG. 14. In addition to covering an N-channel active area 142, the cell plate 61, and the hedge 143, the entire P-channel region 145 has also been covered.

Figure 15:
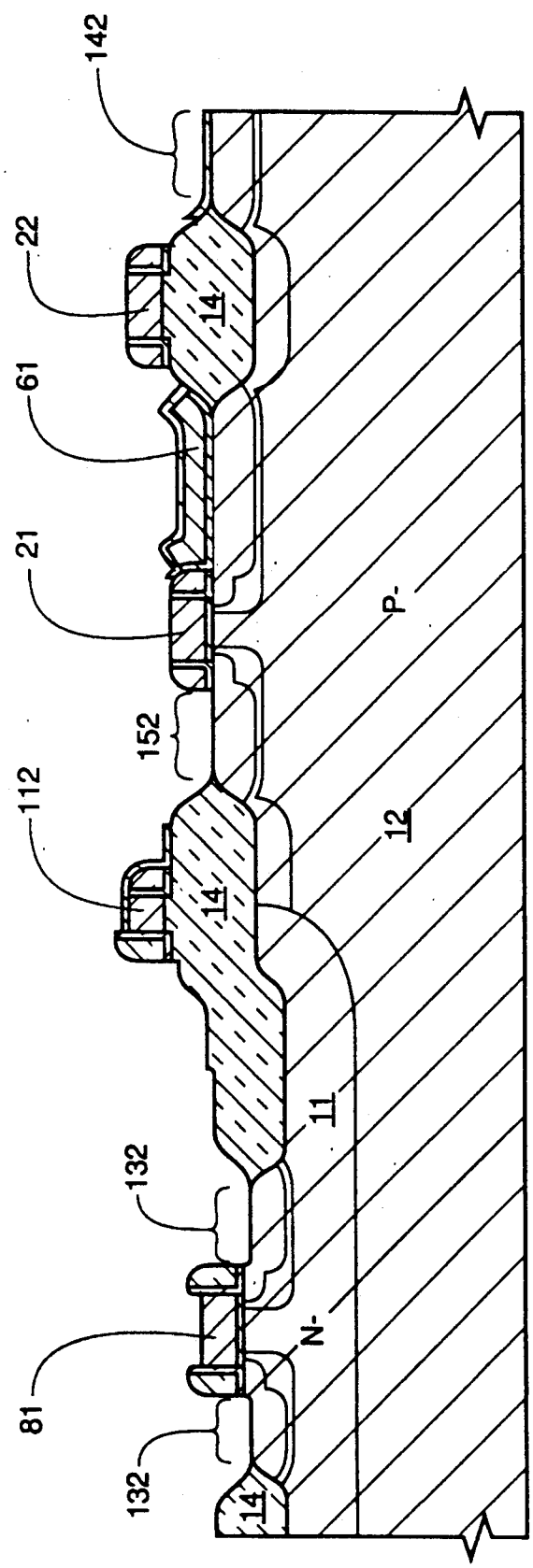
FIG. 15 is a cross-sectional view of the circuit of FIG. 14 following an etch of all silicon dioxide that is not subjacent the silicide isolation mask.

Referring now to FIG. 15, a silicon dioxide etch of the circuitry of FIG. 14 has removed all silicon dioxide that is not subjacent the silicide isolation mask 141, thus exposing polysilicon on the P-channel transistor gate 81, the N-channel transistor gate 21, and the word line 22. Silicon substrate is also exposed in the P-channel active areas 132 and in the N-channel bit line contact region 152.

Figure 15A:
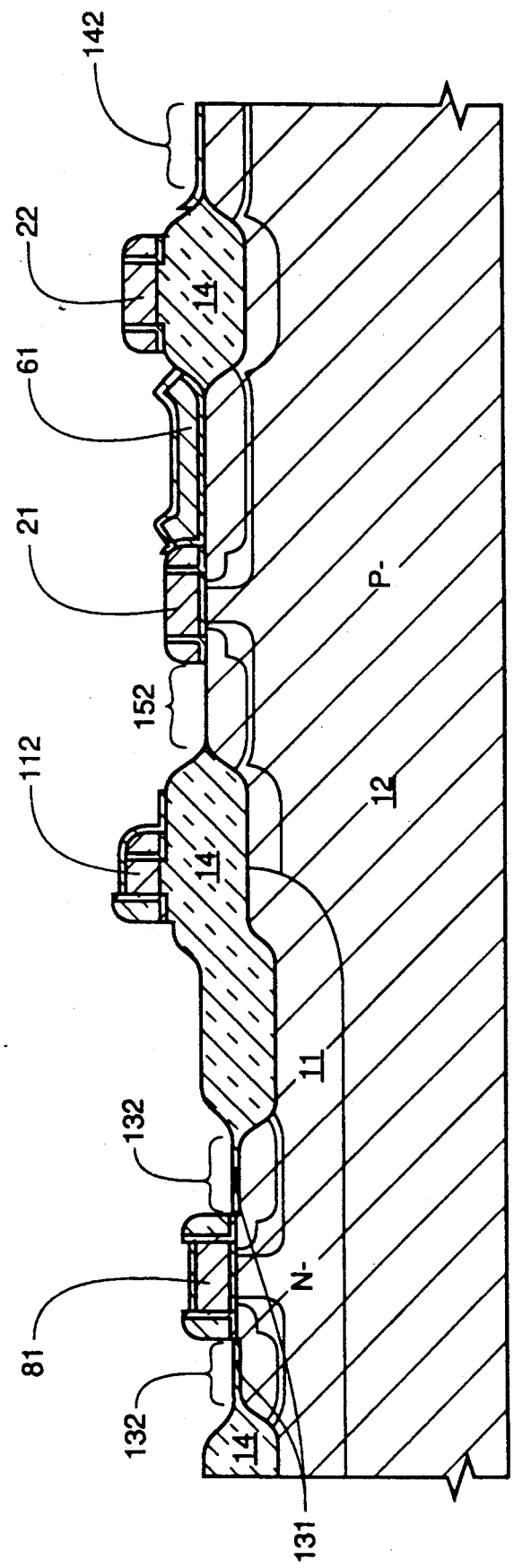
FIG. 15A is a cross-sectional view of the circuit of FIG. 14A following an etch of all silicon dioxide that is not subjacent the silicide isolation mask.

Referring now to FIG. 15A, a silicon dioxide etch of the circuitry of FIG. 14A has removed all silicon dioxide that is not subjacent the silicide isolation mask 144, thus exposing polysilicon on the upper surfaces of N-channel transistor gate 21 and word line 22. Silicon substrate is also exposed in the N-channel bit line contact region 152.

Figure 16:
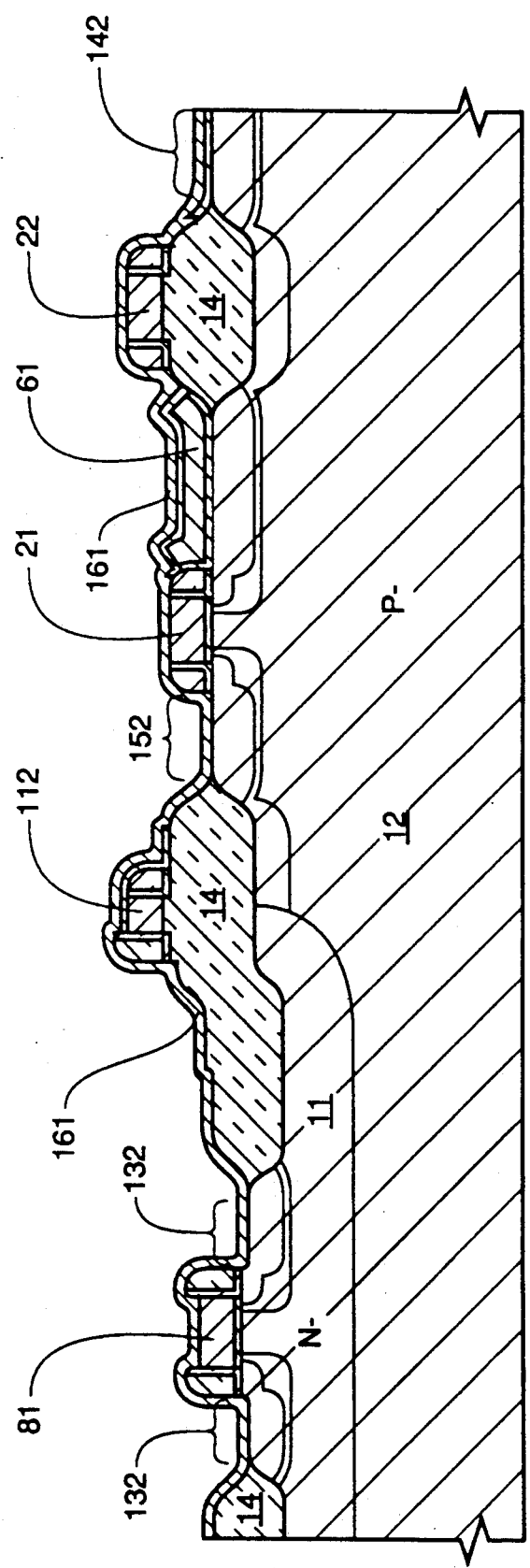
FIG. 16 is a cross-sectional view of the circuit of FIG. 15 following the blanket deposition of a titanium metal layer.

Referring now to FIG. 16, a titanium metal layer 161 has been blanket deposited on top of all circuitry of FIG. 15 (sputter deposition is only one of several usable techniques).

Figure 16A:
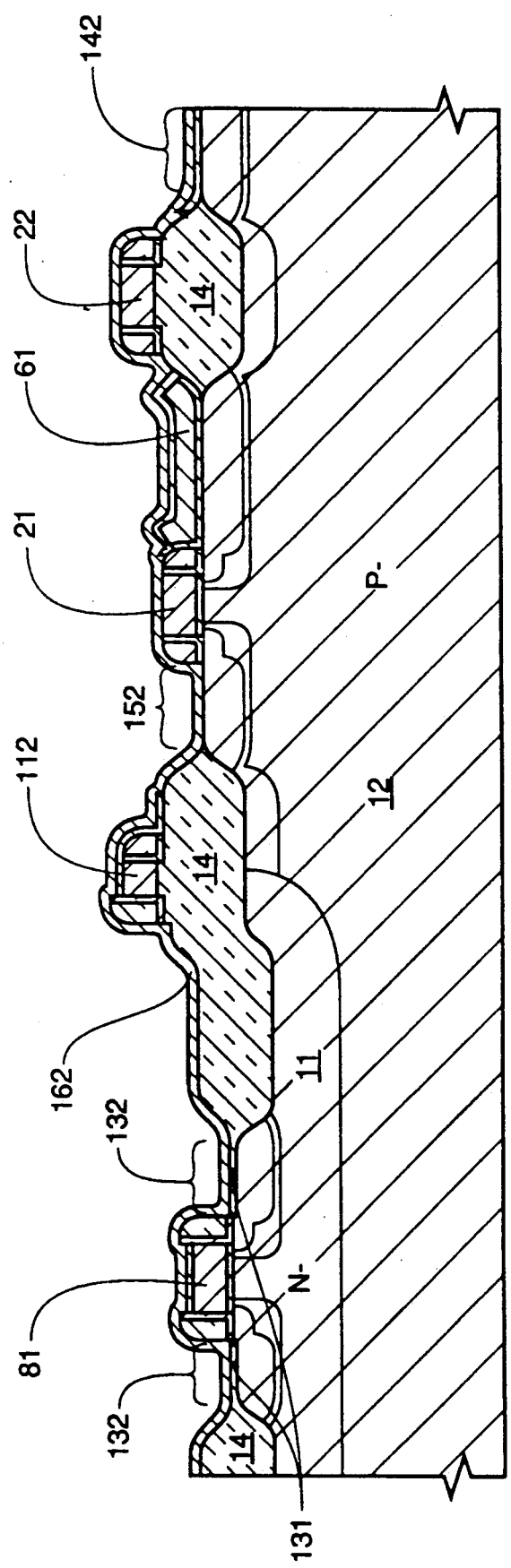
FIG. 16A is a cross-sectional view of the circuit of FIG. 15A following the blanket deposition of a titanium metal layer.

Referring now to FIG. 16A, a titanium metal layer 162 has been sputter deposited on top of all circuitry of FIG. 15A.

Figure 17:
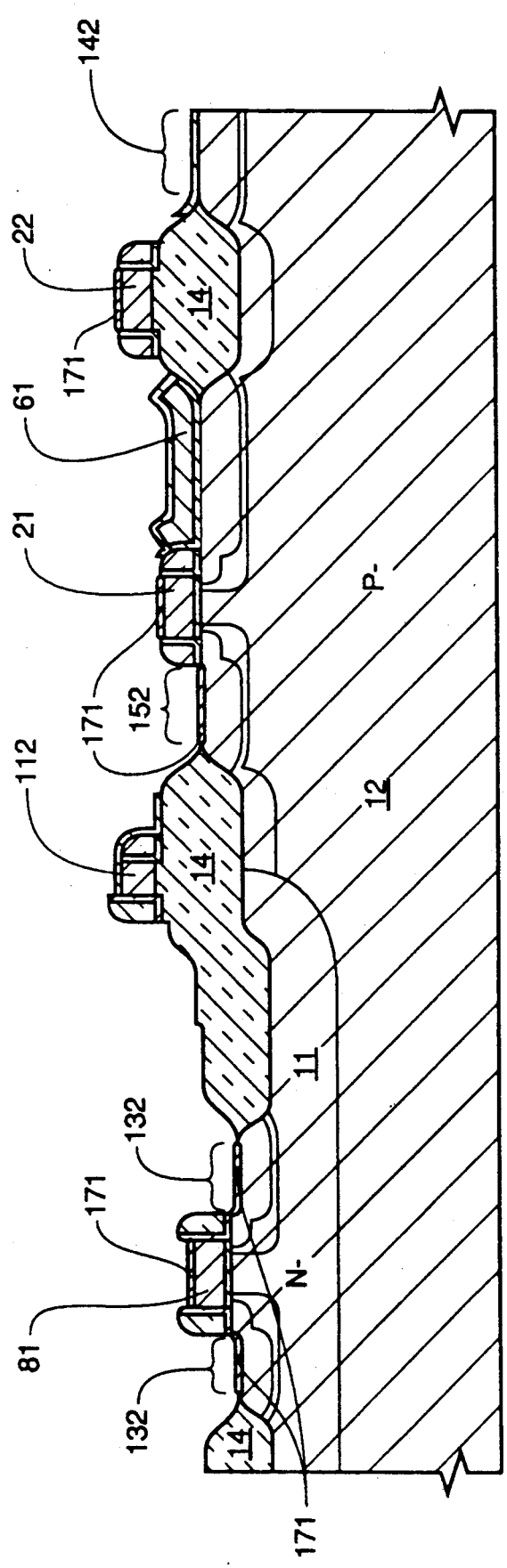
FIG. 17 is a cross-sectional view of the circuit of FIG. 16 following the sintering of the titanium metal layer in a nitrogen ambient and removal of titanium nitride in a sulfuric acid and hydrogen peroxide bath.

Referring now to FIG. 17, the titanium metal layer 161 covering the circuitry of FIG. 16 has been sintered in a nitrogen ambient. During the sintering process, the titanium metal reacts with either exposed silicon (whether polycrystalline or monocrystalline silicon) to form titanium silicide or with the ambient nitrogen to form titanium nitride. As the sintering process proceeds, all titanium covering oxide regions is converted to titanium nitride; titanium covering unprotected silicon is converted to an upper layer of titanium nitride and a lower layer of TiSi. A sulfuric acid and hydrogen peroxide bath removes all titanium nitride. An annealing process then converts the TiSi to a more conductive compound, $TiSi_2$ (titanium silicide). At the completion of the self-aligned silicidation process, the upper surfaces of P-channel transistor gate 81, N-channel transistor gate 21, the word line 22, the P-channel active areas 132, and the bit line contact region 152 are covered with a layer of titanium silicide 171. The silicidation greatly reduces the sheet resistance of the regions affected, thereby enhancing the speed of the circuit.

Figure 17A:
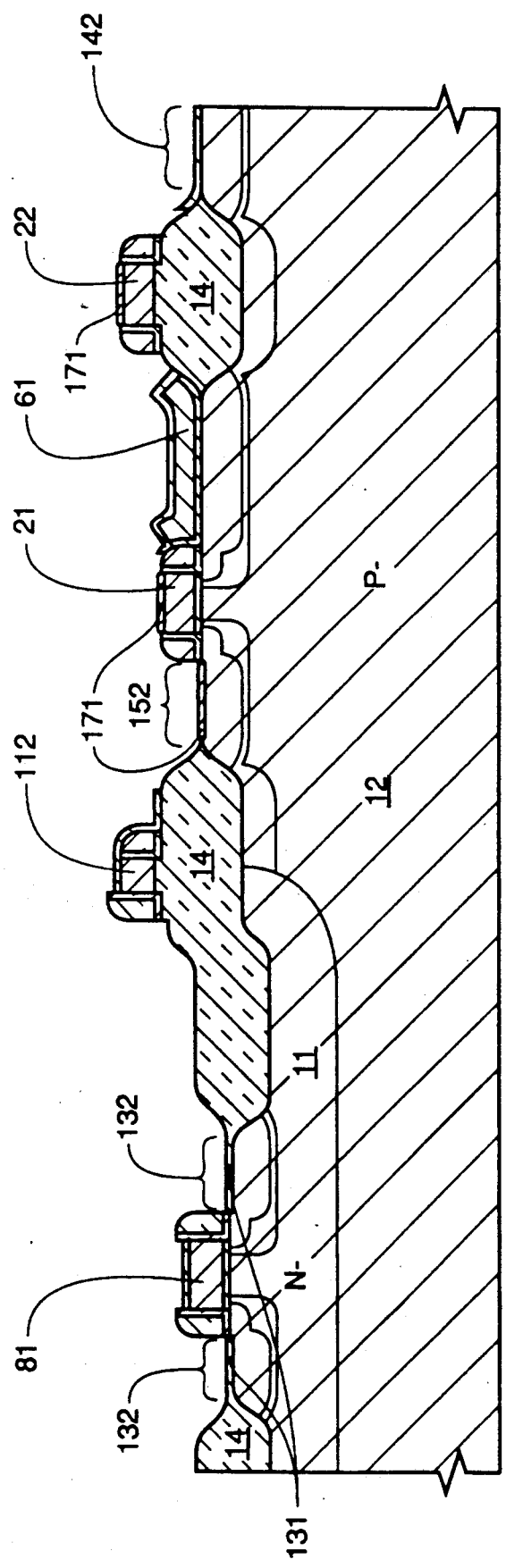
FIG. 17A is a cross-sectional view of the circuit of FIG. 16A following the sintering of the titanium metal layer in a nitrogen ambient and removal of titanium nitride in a sulfuric acid and hydrogen peroxide bath.

Referring now to FIG. 17A, the titanium metal layer 162 covering the circuitry of FIG. 16A has been sintered in a nitrogen ambient. The sintering step proceeds as explained in the previous paragraph. At the completion of the self-aligned silicidation process, the upper surfaces of N-channel transistor gate 21, word line 22, and N-channel bit line contact region 152 are covered with a layer of titanium silicide 171.

Figure 18:
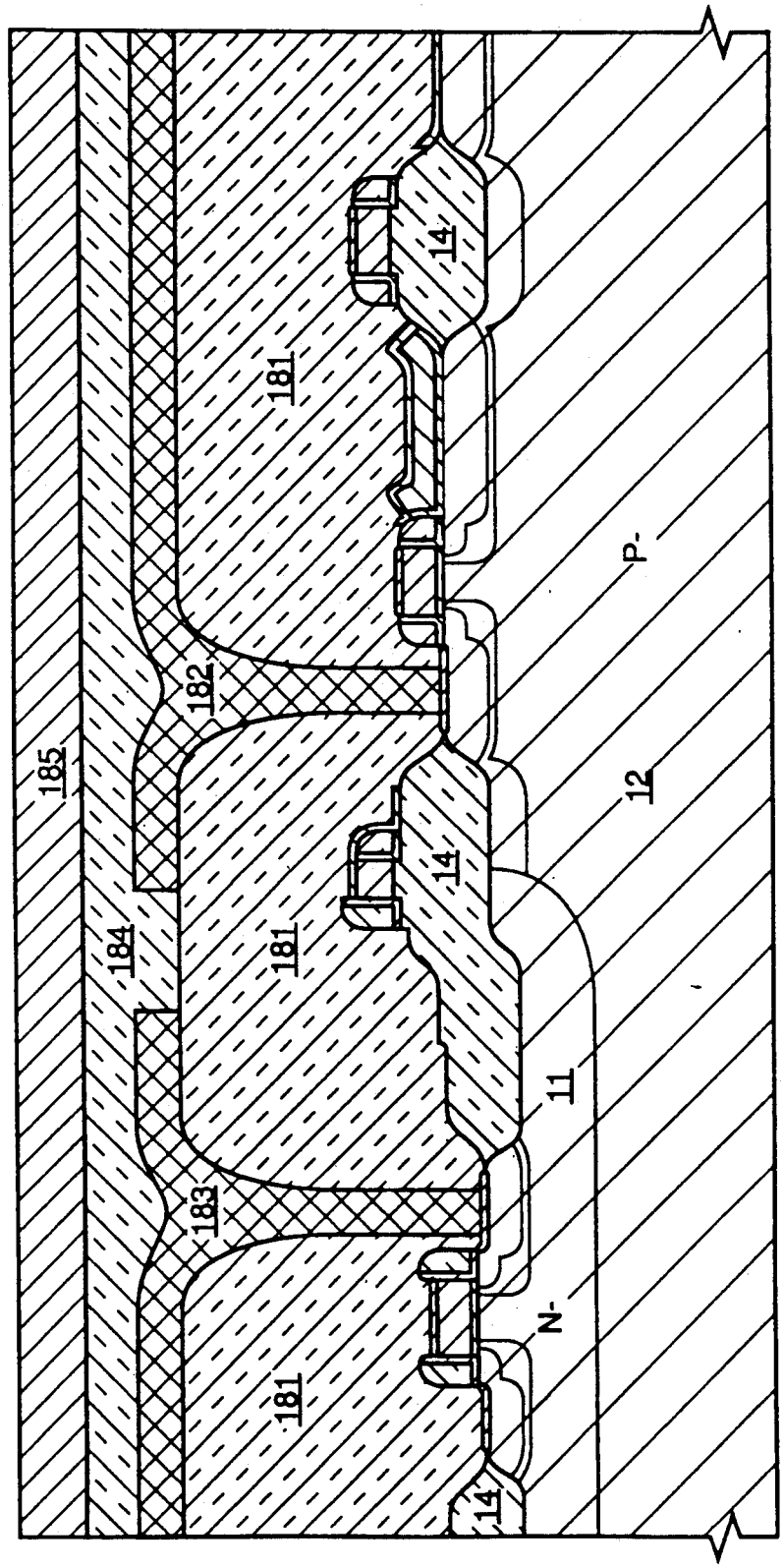
FIG. 18 is a cross-sectional view of the circuit of FIG. 17 following completion of the circuit in a conventional manner.

Referring now to FIG. 18, the circuitry of FIG. 17 has been completed in a conventional manner by depositing a layer of boro-phospho-silicate glass (BPSG) 181, etching a bit-line via and a P-channel access-line via through BPSG layer 181, deposition and etching of a metal contact layer to create a bit line 182 and a P-channel access-line 183, deposition of a silicon dioxide passivation layer 184 and a final silicon nitride passivation layer 185.

Figure 18A:
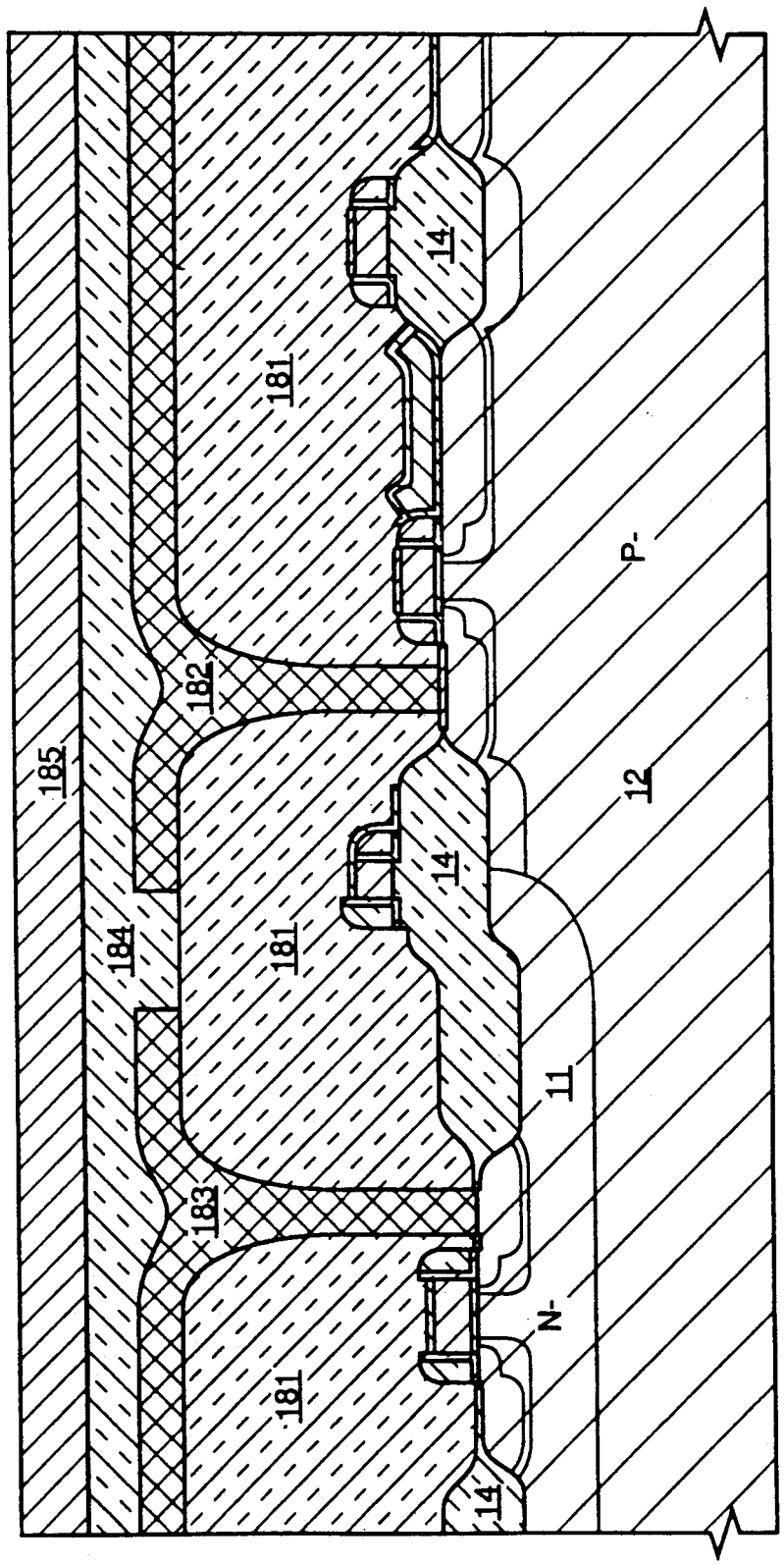
FIG. 18A is a cross-sectional view of the circuit of FIG. 17A following the completion of the circuit in a conventional manner.

Referring now to FIG. 18A, the circuitry of FIG. 17A has been completed in a conventional manner by depositing a layer of boro-phospho-silicate glass (BPSG) 181, etching a bit-the via through BPSG layer 181 and a P-channel access-line via through BPSG layer 181 and second anti-silicidation oxide layer 131, deposition and etching of a metal contact layer to create a bit line 182 and a P-channel access-line 183, deposition of a silicon dioxide passivation layer 184 and a final silicon nitride passivation layer 185.

Although only several embodiments of the split-polysilicon CMOS DRAM process incorporating selective self-aligned silicidation of conductive regions and nitride blanket protection of N-channel regions during P-channel gate spacer formation, have been described herein, it will be apparent to one skilled in the art that changes and modifications may be made thereto without departing from the spirit and the scope of the invention as claimed. For example, the same process flow could be used to create P-channel and N-channel devices on a lightly-doped N-type substrate (arsenic or phosphorus-doped silicon having a conductivity opposite to that of the lightly-doped P-type substrate used to begin the process described in detail heretofore). In such a case, a P-well, rather than an N-well would be created in the substrate, and so forth. In addition, P-channel transistors—rather than N-channel transistors—could be used for DRAM cell access. Furthermore, other refractory metals (other than titanium) could also be used for self-aligned silicidation of conductive regions.

We claim:

1. A split-polysilicon process for creating CMOS DRAM circuitry having self-alignedly silicided transistor gates and active areas, on semiconductor material having both N-type material regions and P-type material regions, both types of said regions being covered by a gate dielectric layer, said process comprising the following sequential steps:

a) blanket deposition of a first polysilicon layer on top of the gate dielectric layer;
b) masking of said first polysilicon layer with a first photomask which, in P-type material regions, defines N-channel gates and interconnects and in N-type material regions, blankets said first polysilicon layer;
c) removal of those portions of said first polysilicon layer that are not subjacent the first photomask with a first polysilicon etch;
d) stripping of said first photomask;
e) self-aligned implantation of a P-type conductivity-creating impurity which functions as a punch-through implant in N-channel active areas;
f) blanket deposition of a first principal silicon dioxide spacer layer;
g) anisotropically etching the heretofore deposited silicon dioxide in order to create N-channel transistor gate spacers, and to remove all silicon dioxide from N-channel active areas;
h) self-aligned, high-dosage implantation of an N-type conductivity-creating impurity to create heavily-doped drain and source regions for N-channel transistors;
i) blanket deposition of a first silicon nitride layer;
j) blanket deposition of a second polysilicon layer;
k) masking of said second polysilicon layer with a second photomask, said second photomask defining a cell plate;
l) removal of those portions of said second polysilicon layer that are not subjacent to the second photomask with a second polysilicon etch to create the cell plate;
m) removal of those portions of said first silicon nitride layer that are exposed by said second polysilicon etch;
n) blanket deposition of a first anti-silicidation silicon dioxide layer;
o) blanket deposition of a protective nitride layer;
p) masking of the protective nitride layer with a third photomask that blankets the P-type material regions and defines the P-channel transistor gates and interconnects in the N-type material regions;
q) removal of those portions of said protective nitride layer that are not subjacent the third photomask with a second nitride etch;
r) anisotropically etching away those portions of the anti-silicidation silicon dioxide layer that were exposed by the second nitride etch;
s) anisotropically etching away those portions of the first polysilicon layer that were exposed by etching away portions of the anti-silicidation silicon dioxide layer;
t) self-aligned implantation of an N-type conductivity-creating impurity which functions as a punch-through implant in P-channel active areas;
u) blanket deposition of a second principal silicon dioxide spacer layer;
v) anisotropically etching the heretofore deposited silicon dioxide to create P-channel transistor gate sidewall spacers;
w) self-aligned, high-dosage implantation of a P-type conductivity-creating impurity to create heavily-doped source and drain regions for P-channel transistors;
x) stripping the protective nitride layer with a third nitride etch;
y) blanket deposition of a refractory metal layer;
aa) sintering the refractory metal layer in a nitrogen ambient to create a refractory-metal-nitride-covered refractory metal-silicon compound on unoxidized silicon surfaces and refractory metal nitride on all other surfaces;
bb) removal of all refractory metal nitride; and
cc) annealing the refractory metal-silicon compound to convert it to refractory metal silicide.

2. The process of claim 1, which further comprises the step of removing those portions of the gate dielectric layer that were exposed by the first polysilicon etch following the completion of step c) and prior to the initiation of step d).

3. The process of claim 2, wherein removal of gate dielectric is accomplished with the first polysilicon etch.

4. The process of claim 1, which further comprises the step of stripping said second photomask following the completion of step 1) and prior to the initiation of step m).

5. The process of claim 1, which further comprises the step of stripping said second photomask following the completion of step m) and prior to the initiation of step n).

6. The process of claim 1, which further comprises an isotropic oxide etch following the completion of step g) and prior to the initiation of step h).

7. The process of claim 1, which further comprises an elevated-temperature implant drive-in step subsequent to step x).

8. The process of claim 1, which further comprises the step of oxidizing all exposed silicon subsequent to step x) and prior to the initiation of step z).

9. The process of claim 9, which further comprises the step of protecting selected oxide-covered silicon regions from silicidation by masking those selected regions with a silicide isolation photomask following the oxidation step of claim 9.

10. The process of claim 1, wherein all polysilicon layers are conductively doped following deposition.

11. The process of claim 1, wherein the refractory metal is titanium.

12. The process of claim 11, wherein removal of all titanium nitride is accomplished with a sulfuric acid and hydrogen peroxide bath.

13. The process of claim 1, which further comprises the steps of:
a) blanket deposition of a mini silicon dioxide spacer layer following the punch-through implant of step e); and
b) prior to step f), the self-aligned, low-dosage implanting of an N-type conductivity-creating impurity to create lightly-doped N-channel transistor drain and source regions.

14. The process of claim 1, which further comprises the steps of:
a) the creation of a mini silicon dioxide spacer layer on all exposed silicon surfaces following the punch-through implant of step e); and
b) prior to step f), the self-aligned, low-dosage implanting of an N-type conductivity-creating impurity to create lightly-doped drain and source regions for N-channel transistors.

15. The process of claim 14, wherein said mini silicon dioxide spacer layer is created by the thermal oxidation of all exposed silicon.

16. The process of claim 1, which further comprises the following steps inserted between steps t) and u):
 a) blanket deposition of a second mini silicon dioxide spacer layer; and
 b) self-aligned, low-dosage implantation of a P-type conductivity-creating impurity to create lightly-doped P-channel transistor drain and source regions.

17. The process of claim 1, which further comprises the following steps inserted between steps t) and u):
 a) the creation of a mini silicon dioxide spacer layer on all exposed silicon surfaces; and
 b) self-aligned, low-dosage implantation of a P-type conductivity-creating impurity to create lightly-doped drain and source regions for P-channel transistors.

18. The process of claim 17, wherein said mini silicon dioxide spacer layer is created by the thermal oxidation of all exposed silicon.

* * * * *

UNITED STATES PATENT AND TRADEMARK OFFICE
CERTIFICATE OF CORRECTION

PATENT NO. : 5,030,585
DATED : July 9, 1991
INVENTOR(S) : Fernando Gonzalez et al.

It is certified that error appears in the above-indentified patent and that said Letters Patent is hereby corrected as shown below:

ON THE TITLE PAGE:

In the Abstract, line 15, delete "P-channel channel" and insert -- P-channel --.

Column 5, line 21, delete "Figure" and insert -- Figure 1, --.

Column 6, line 22, delete "insulted" and insert -- insulated --.

Column 7, line 8, delete "remants" and insert -- remnants --.

Column 9, line 34, delete "1)" and insert -- 1) --.

Signed and Sealed this

Twenty-fifth Day of January, 1994

Attest:

BRUCE LEHMAN

*Attesting Officer*   *Commissioner of Patents and Trademarks*